(12) United States Patent
Yamamoto et al.

(10) Patent No.: US 7,807,004 B2
(45) Date of Patent: Oct. 5, 2010

(54) METHOD FOR JOINING ADHESIVE TAPE

(75) Inventors: Masayuki Yamamoto, Ibaraki (JP); Yukitoshi Hase, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 127 days.

(21) Appl. No.: 11/966,941

(22) Filed: Dec. 28, 2007

(65) Prior Publication Data

US 2008/0169056 A1 Jul. 17, 2008

(30) Foreign Application Priority Data

Jan. 15, 2007 (JP) .............................. 2007-006126

(51) Int. Cl.
*B29C 65/48* (2006.01)
(52) U.S. Cl. ..................... 156/152; 156/510
(58) Field of Classification Search ................. 156/353, 156/358, 360, 362, 363, 152, 510
See application file for complete search history.

(56) References Cited

U.S. PATENT DOCUMENTS

| | | | | |
|---|---|---|---|---|
| 7,503,365 B2 * | 3/2009 | Ametani | ...................... | 156/353 |
| 2003/0173035 A1 * | 9/2003 | Yamaguchi | ................. | 156/580 |
| 2006/0231202 A1 * | 10/2006 | Sakata et al. | ................ | 156/344 |
| 2009/0098376 A1 * | 4/2009 | Fukuoka | ..................... | 428/337 |

FOREIGN PATENT DOCUMENTS

JP   2000-349136 A   12/2000
JP   2006-269915 A   10/2006

OTHER PUBLICATIONS

The First Office Action for the Application No. 200810001054.4 from The State Intellectual Property Office of the People's Republic of China dated May 4, 2010.

* cited by examiner

*Primary Examiner*—Kat Wyrozebski
*Assistant Examiner*—Vishal I Patel
(74) *Attorney, Agent, or Firm*—Cheng Law Group, PLLC

(57) ABSTRACT

This invention is directed to a method for joining an adhesive tape having the steps (1) separating, from a first adhesion face of a double-sided adhesive tape having first and second separators attached to front and back adhesion faces thereof, the first separator, and joining the double-sided adhesive tape to a surface of a substrate; (2) joining the double-sided adhesive tape to the substrate while a joining roller provided in a tape joining unit presses the second separator with rolling, and taking up the second separator wound and turned around by the joining roller and separated from a second adhesion face of the double-sided adhesive tape in a second separator collecting unit provided in the tape joining unit while rolling the joining roller synchronously; and (3) cutting the double-sided adhesive tape joined to the substrate with the adhesion faces thereof being exposed along with a contour of the substrate.

2 Claims, 11 Drawing Sheets

(a)

(b)

(c)

(a)

(b)

METHOD FOR JOINING ADHESIVE TAPE

BACKGROUND OF THE INVENTION (1) Field of the Invention

The present invention relates to a method for use in a case of laminating a substrate for reinforcement onto various kinds of substrates, such as semiconductor wafers, glass substrates, and wiring boards through a double-sided adhesive tape, and to an apparatus using the method.

(2) Description of the Related Art

Semiconductor wafers (hereinafter referred to as "wafer") are obtained in a manner that the back side of the wafer is ground by a back grinding process after formation of a large number of elements on the wafer, and subsequently the wafer is cut into each element in a dicing process. However, as demand for a higher density packaging increases in recent years, a smaller wafer thickness level from 100 micrometers to 50 micrometers, and furthermore a level of approximately 25 micrometers tend to be needed.

The wafer that has been subjected to back grinding into such a level of thickness may have possible brittleness and distortion, leading to extremely poor handling property.

Accordingly, a method of reinforcement of the wafer by lamination of a substrate having rigidity such as glass plate etc. to a wafer through an adhesive sheet has been proposed.

In detail, a wafer having an adhesive tape beforehand applied on the top face thereof is mounted in a holding stand, and a base made of a glass plate etc. (a supporting substrate for reinforcement) is held at the upper end of a base supporting section in a slanting attitude over this wafer. In this condition, a press roller is moved to the surface of the base, the base supporting section is lowered corresponding to the movement, thereby laminating the base onto the semiconductor wafer (refer to JP-A No. 2000-349136).

For the lamination of the base, a double-sided adhesive tape that has separators attached to front and back adhesion faces thereof is used as an adhesive tape to be joined to the wafer. The adhesion face exposed by separation of one of the separators is joined to the surface of the wafer. Subsequently the adhesive tape is cut along with the contour of the wafer, thereby preparing the wafer to which the double-sided adhesive tape having the separator left on the surface thereof is joined. This wafer is then transported in a laminating apparatus in a different process. Here, a process for laminating the wafer on the base is performed.

In this case, the separator left on the surface of the adhesive tape needs to be separated prior to the laminating process in order to expose the adhesion face for lamination of the base. This separator is manually separated by an operator, leading to difficulty in improvement of workability.

SUMMARY OF THE INVENTION

The present invention aims at providing a method for joining an adhesive tape allowing efficient joining of a double-sided adhesive tape for lamination of a substrate, such as a wafer and a supporting substrate for reinforcement and the present invention also aims at providing an apparatus using the method.

The present invention employs following configurations in order to achieve such objects.

A method for joining a double-sided adhesive tape to a substrate, the method comprising:

separating, from a first adhesion face of a double-sided adhesive tape having first and second separators attached to front and back adhesion faces thereof, the first separator, and joining the double-sided adhesive tape to a surface of a substrate;

separating the second separator from the second adhesion face of the double-sided adhesive tape joined to the substrate; and cutting the double-sided adhesive tape joined to the substrate along with a contour of the substrate.

According to this method, the double-sided adhesive tape is joined to the substrate in the tape joining process, and the adhesion face corresponding to the surface of the double-sided adhesive tape is exposed in the tape cutting process. Accordingly, the separator may not be separated so as to expose the adhesion face in a post process. Therefore, a process for laminating a supporting substrate for reinforcement on the substrate can be performed immediately. That is, workability can be improved.

Preferably, the above-described method is implemented as follows.

For example, the tape joining process and the separator separating process are carried out at the same time.

According to this method, the substrate to which the double-sided adhesive tape is joined with the adhesion face exposed can be obtained efficiently in a short time, in comparison with a case where the tape is joined to the substrate and then the separator is separated from the tape in a different process.

Alternatively, in the tape joining process, the double-sided adhesive tape is joined to the substrate while a joining roller presses the second separator with rolling, and in the separator separating process, the second separator is separated by being wound and turned around by an edge member that follows from the rear in synchronization with the rolling of the joining roller.

This method can attain the same effect as that of the above-described method.

Preferably, the above-described method further comprises: laminating a supporting substrate for reinforcement on the second adhesion face after cutting of the double-sided adhesive tape into a shape of the substrate in the tape cutting process.

According to this method, the substrate to which the double-sided adhesive tape is joined with the adhesion face exposed may not be collected temporarily. Accordingly, the process for laminating the supporting substrate for reinforcement on the substrate can be performed immediately. Thus, the substrate reinforced with the supporting substrate can be obtained efficiently.

Furthermore, the present invention employs following configurations, in order to achieve the objects.

A first apparatus for joining a double-sided adhesive tape to a substrate, the apparatus comprising:

a chuck table for holding a substrate;

a tape feed device for separating, from a first adhesion face of a double-sided adhesive tape having first and second separators attached to front and back adhesion faces thereof, the first separator, and feeding the double-sided adhesive tape onto the chuck table;

a joining roller for pressing the double-sided adhesive tape fed on the chuck table in the state that the first separator is separated, from a side of the second separator with rolling, and joining the double-sided adhesive tape to a surface of the substrate;

a separator collecting device for separating the second separator wound and turned around by the joining roller from the double-sided adhesive tape in association with the forward movement for joining of the joining roller, and taking up the second separator in synchronization with the forward movement for joining of the joining roller; and a tape cutting mechanism including a cutter blade for cutting the double-sided adhesive tape joined to the substrate along with a contour of the substrate.

A second apparatus for joining a double-sided adhesive tape to a substrate, the apparatus comprising:

a chuck table for holding a substrate;

a tape feed device for separating, from a first adhesion face of a double-sided adhesive tape having first and second separators attached to front and back adhesion faces thereof, the first separator, and feeding the double-sided adhesive tape onto the chuck table;

a joining roller for pressing the double-sided adhesive tape fed on the chuck table in the state that the first separator is separated, from a side of the second separator with rolling, and joining the double-sided adhesive tape to a surface of the substrate;

a separator collecting device for separating the second separator wound and turned around by an edge member provided at the rear of the joining roller from the double-sided adhesive tape in association with the movement of the edge member, and taking up the second separator in synchronization with the movement of the edge member; and a tape cutting mechanism including a cutter blade for cutting the double-sided adhesive tape joined to the substrate along with a contour of the substrate.

According to this apparatus, the double-sided adhesive tape from which the first separator is separated is joined to the surface of the substrate by the rolling of the joining roller. At the same time or after a time lag, the second separator is separated from the double-sided adhesive tape by being wound and turned around by the joining roller or the edge member to expose the adhesion face. That is, the above-described method invention can be realized suitably.

Preferably, the above-described apparatus further comprises: a mechanism for laminating a supporting substrate for reinforcement on the second adhesion face of the double-sided adhesive tape joined to the substrate.

According to this configuration, the substrate to which the double-sided adhesive tape is joined with the adhesion face exposed may not be collected temporarily. Accordingly, the process for laminating the supporting substrate for reinforcement on the substrate can be performed immediately. Thus, the substrate reinforced with the supporting substrate can be obtained efficiently.

In the above-described apparatus, the joining roller and the separator collecting device are moved together in a manner that a transportation distance of the second separator separated by the joining roller becomes constant.

Alternatively, the edge member and the separator collecting device are moved together in a manner that a transportation distance of the second separator separated by the edge member becomes constant.

These configurations can prevent the sag of the wound second separator.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Figure 1:
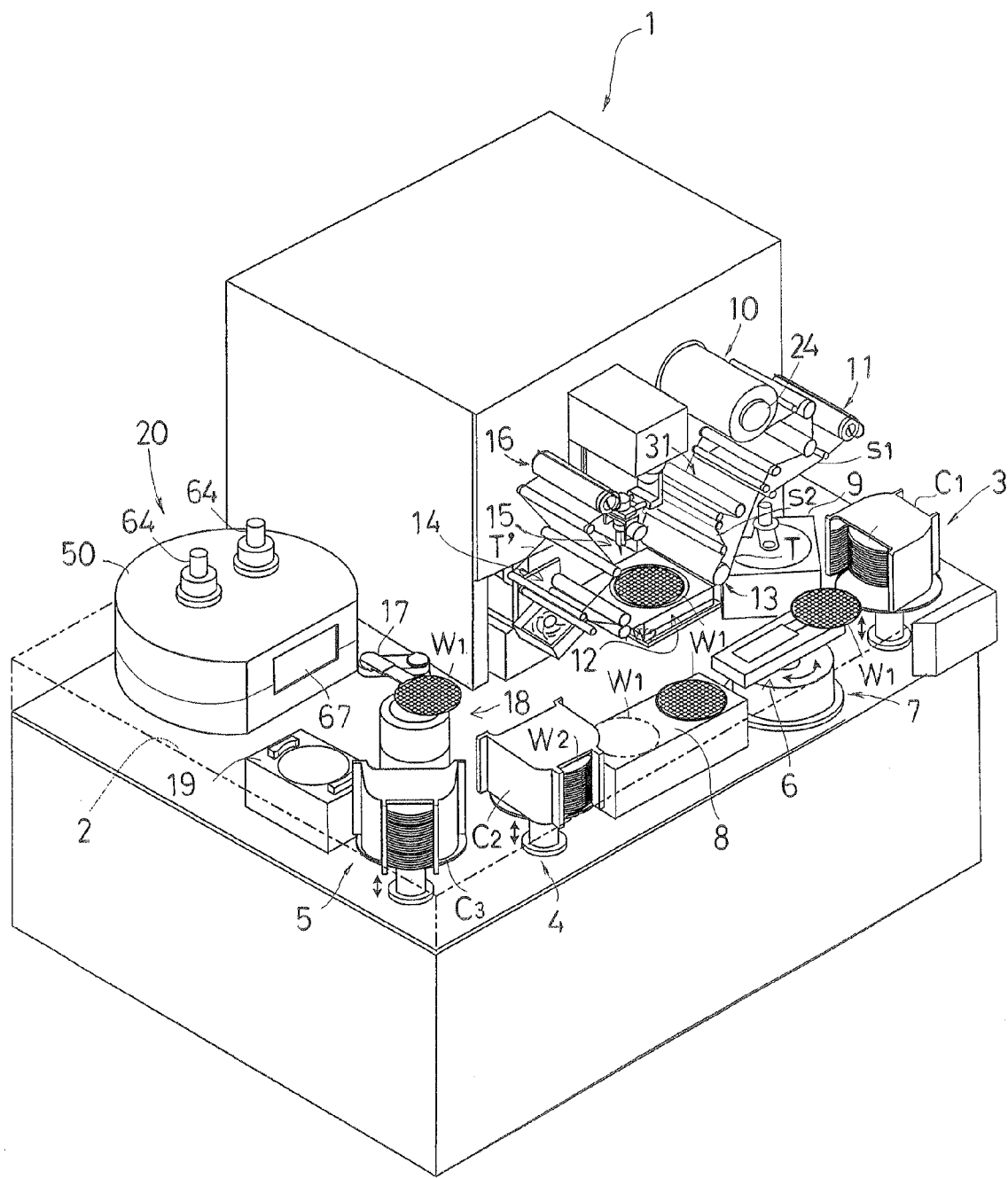
FIG. 1 is a perspective view of an apparatus for laminating a substrate.

Hereinafter, one example of the present invention will be described with reference to the drawing.

In this example, a semiconductor wafer will be described as an example of a substrate to which an adhesive tape is joined.

Figure 2:
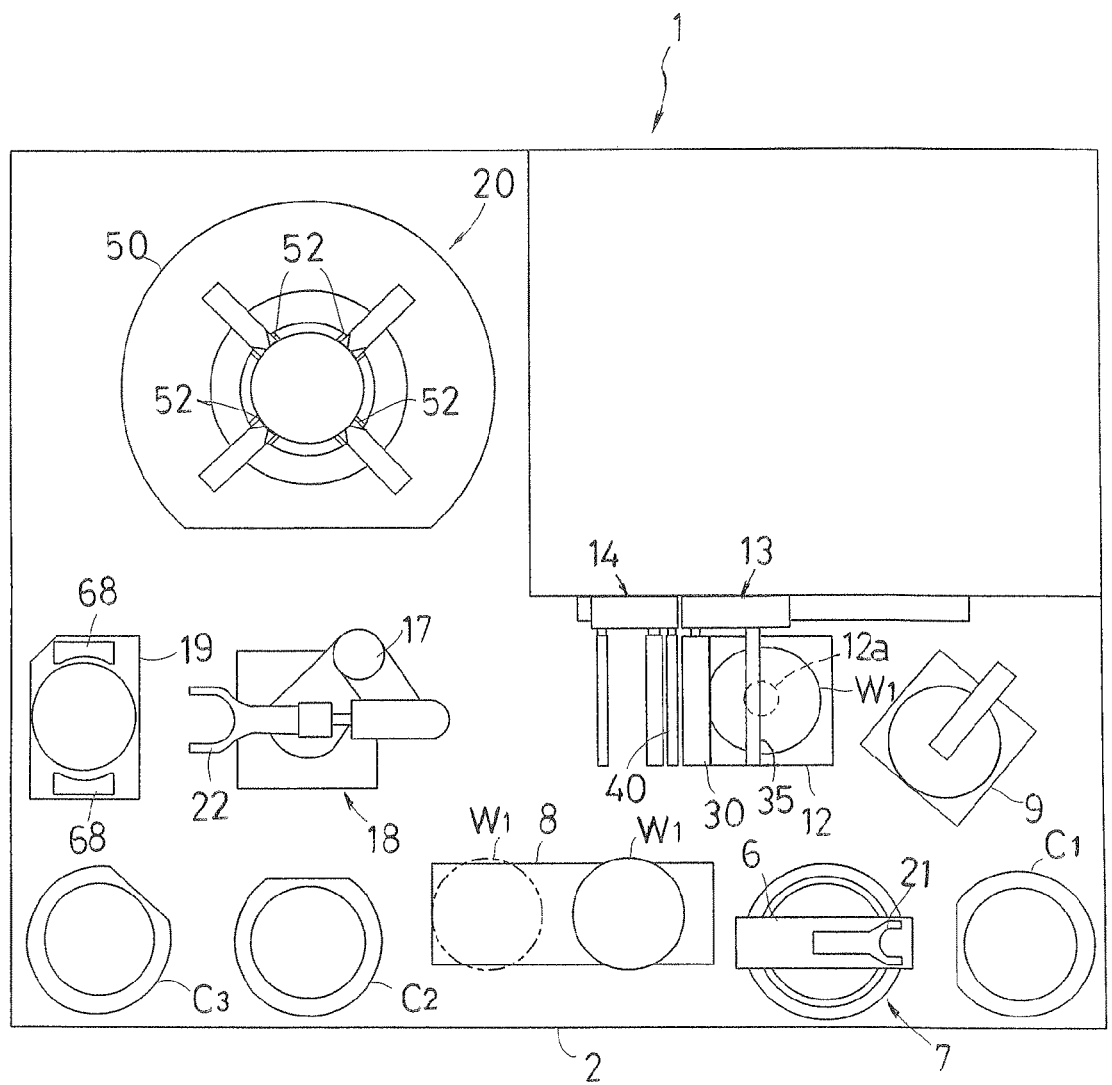
FIG. 2 is a plan view illustrating an entire configuration of an apparatus for laminating a substrate.
Figure 3:
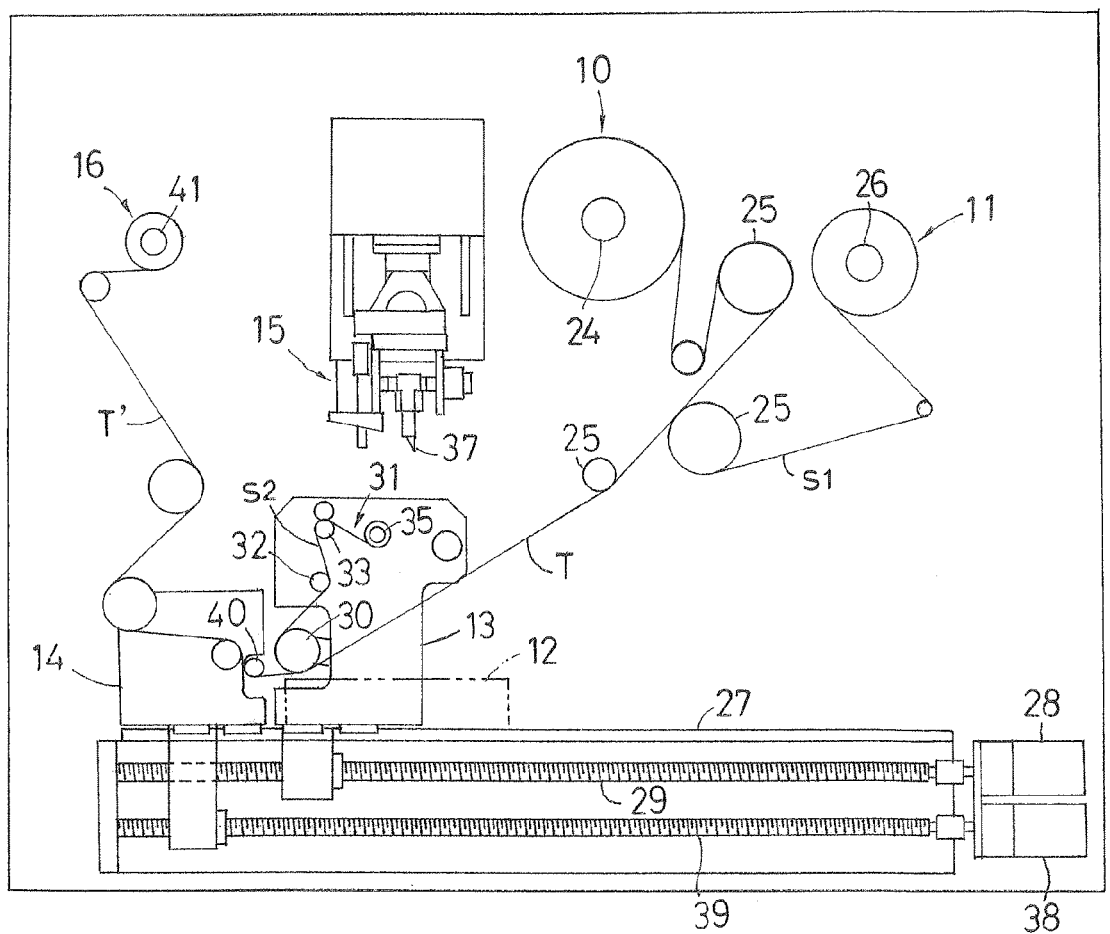
FIG. 3 is a front view illustrating main components of an apparatus for laminating a substrate.

FIG. 1 illustrates an entire perspective view of an apparatus for laminating a substrate that performs the method for joining an adhesive tape by the present invention. FIG. 2 illustrates a plan view thereof. FIG. 3 illustrates a front view thereof.

The apparatus for laminating a substrate 1 of this example, as illustrated in FIGS. 1 to 3, comprises a wafer feed section 3 for loading a cassette C1 that stores a semiconductor wafer W1 (hereinafter referred to only as "wafer W1") as one example of a substrate at the front right of a base 2; a supporting substrate feed section 4 for loading a cassette C2 that stores a supporting substrate W2 as a reinforcing substrate having almost the same shape as that of the wafer W1 at the center front of the base 2, the supporting substrate being made of a glass plate, a stainless steel, etc.; and a wafer collecting section 5 for collecting the wafer W1 having the supporting substrate W2 laminated thereto at the front left of the base 2. A first transport mechanism 7 provided with a robot arm 6, and a second transport mechanism 8 that horizontally transports the wafer W1 with a conveying belt are arranged between the wafer feed section 3 and the supporting substrate feed section 4. Furthermore, a first alignment stage 9 is arranged in the inner part of right side of the base 2. In the upper part, a tape feed section 10 for supplying a double-side adhesive tape T to the wafer W1 is arranged. A first separator collecting section 11 is arranged for collecting only a first separator s1 separated from one of adhesion faces of a double-sided adhesive tape T with a separator that has been supplied from the tape feed section 10, diagonally below to the right direction of the tape feed section 10. On the left of the alignment stage 9 are provided a chuck table 12 for suction-holding the wafer W1; a tape joining unit 13 for joining the double-sided adhesive tape T to the wafer W1 held in this chuck table 12; and a tape separating unit 14 for separating an unnecessary tape T' after joining of the double-sided adhesive tape T to the wafer W1. A tape cutting mechanism 15 for cutting the double-sided adhesive tape T joined to the wafer W1 along with the contour of the wafer W1 is arranged in the upper part of the chuck table 12. A tape collecting section 16 for colleting the unnecessary tape T' is arranged in the left-hand side upper part. A third transport mechanism 18 provided with a robot arm 17 is arranged on the left of the tape joining unit 13. A second alignment stage 19 is arranged on the left. Furthermore, a mechanism for laminating a substrate 20 for laminating the wafer W1 and the supporting substrate W2 is arranged in the left-hand side back. Hereinafter, each configuration will be specifically described.

The wafer feed section 3, the supporting substrate feed section 4, and the wafer collecting section 5 are provided with a cassette base that can ascend and descend. The cassettes C1 to C3 stored in each cassette base store the wafer W1, the supporting substrate W2, and the wafer W1 with the supporting substrate in multi-stage, respectively. At this time, within the cassettes C1 and C3, the wafer W1 is maintaining a horizontal attitude with a pattern surface side facing upward.

The first transport mechanism 7 and the third transport mechanism 18 are provided with the robot arms 6 and 17, and bent and rotated with a drive mechanism (not illustrated).

As illustrated in FIG. 2, the robot arms 6 and 17 are provided with substrate holding sections 21 and 22 with a horseshoe shape at the edge thereof. Each of the substrate holding sections 21 and 22 has a sucking hole (not illustrated), and sucks the wafer W1 and the supporting substrate W2 that have been stored in the cassettes C1 and C2 with vacuum from the back side thereof.

That is, while the robot arm 6 suction-holds the wafer W1 from the back side through a clearance between the wafers W stored in the cassette C1 in a multi-stage after movement of the substrate holding section 21, and the robot arm 6 transports the suction-held wafer W1 in order of the first alignment stage 9 (described later), the holding section 12, and the second transport mechanism 8.

The robot arm 17 transports the wafer W1 with the double-side adhesive tape transported by the second transport mechanism 8 in order of the second alignment stage 19 and the mechanism for laminating a substrate 20. Furthermore, after movement of the substrate holding section 22, the robot arm 17 transports the suction-held supporting substrate W2 in order of the second alignment stage 19 (described later) and the mechanism for laminating a substrate 20, while suction-holding the supporting substrate W2 from the back side through the clearance between the supporting substrate W2 stored in a multi-stage in the cassette C2. Then, the robot arm 17 transports the wafer W1 after lamination of the supporting substrate W2 in the mechanism for laminating a substrate 20 to the cassette C3.

The second transport mechanism 8 is a conveyor type transport mechanism configured with a transportation roller or an endless belt. That is, the second transport mechanism 8 horizontally transports the wafer W1 with the double-sided adhesive tape transported by the robot arm 6 in a position allowing free receive and deliver to the robot arm 17.

The first alignment stage 9 performs position control based on an orientation flat or a notch, etc. of the mounted wafer W1 with an approximately circular shape.

The second alignment stage 19 performs position control of the wafer W1 based on an orientation flat etc. in the same manner as in the first alignment stage 9. Furthermore, the second alignment stage 19 determines a center position for the supporting substrate W2 by catch with a pair of locking claws 68.

Figure 8:
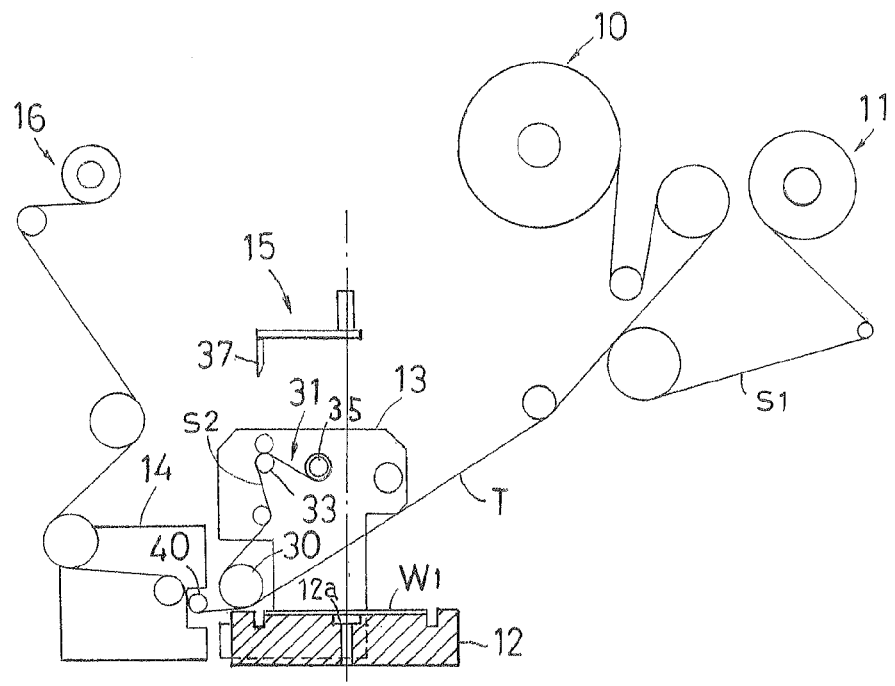
FIGS. 8 to 11 are views illustrating a laminating operation of a double-sided adhesive tape.

In the center of the chuck table 12, as illustrated in FIG. 8, a suction pad 12a for receiving and delivering the wafer W1 is provided so as to freely ascend and descend.

As illustrated in FIG. 1 again, in the tape feed section 10, the double-sided adhesive tape T having an adhesive strength that reduces by heat expansion is wound with the double-sided separators on a bobbin 24. Furthermore, the double-sided adhesive tape T with the separators delivered out from this bobbin 24 is guided to a guide roller 25 illustrated in FIG. 3 with rolling delivery. The tape feed section 10 is supported by a vertical wall of the main body of the device, and the rotation thereof is controlled through a brake mechanism etc. Here, the tape feed section 10 is equivalent to a tape feed device of the present invention.

The first separator collecting section 11 separates a first separator s1 attached to the adhesion face on the substrate joining side, and a collecting bobbin 26 supported by a vertical wall takes up and collects the first separator s1. Furthermore, the first separator collecting section 11 is operatively connected with a drive mechanism, such as a motor (not illustrated).

Figure 4:
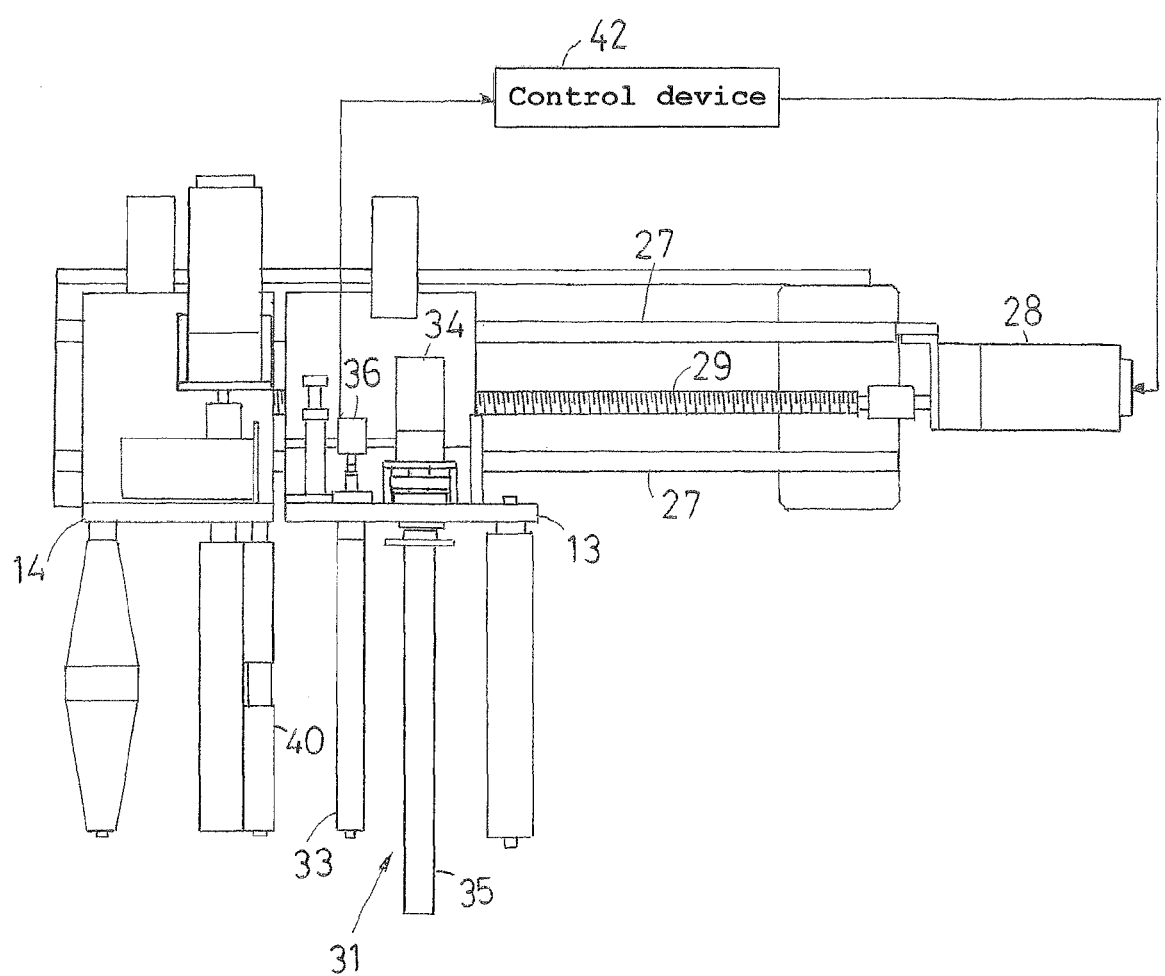
FIG. 4 is a plan view illustrating a tape joining unit and a tape separating unit.

As illustrated in FIGS. 3 and 4, the tape joining unit 13 is gripped by a guide rail 27 so as to be slidable in the tape running direction, and is moved so as to reciprocate and screw-fed with a feed screw 29 driven by a motor 28 in the forward/rearward direction. A joining roller 30 is rotatably supported to the tape joining unit 13. This joining roller 30 joins the double-sided adhesive tape T to the surface of the wafer W1 while the joining roller 30 presses the surface with the separator of the double-sided adhesive tape T with rolling.

Furthermore, the tape joining unit 13 is equipped with a second separator collecting section 31. This second separator collecting section 31 separates the second separator s2 from the surface of the double-sided adhesive tape T joined to the wafer W1, and collects the second separator s2. That is, the second separator s2 separated by being wound and turned around by the joining roller 30 is guided by a guide roller 32, led to a gap between a pair of upper and lower pinch rollers 33, and then taken up and collected by a collecting bobbin 35 driven by a motor 34. Here, the second separator collecting section 31 is equivalent to a separator collecting device of the present invention.

The pinch roller 33 is connected with a rotary encoder 36 for detecting a separator taking-up speed, and a result of the detection is transmitted to a control device 42. The control device 42 controls the rotation of the collecting bobbin 35 so that the collecting bobbin 35 takes up the separator at the same speed as the moving speed of the joining roller 30.

The tape cutting mechanism 15 ascends and descends between an upper waiting position and an action position for cutting the double-sided adhesive tape T by an elevator (not illustrated). Furthermore, the tape cutting mechanism 15 cuts the double-sided adhesive tape T into a shape of the wafer by rotation of a cutter blade 37 along with the contour of the wafer w1.

As illustrated in FIG. 3, the tape separating unit 14 is gripped by a guide rail 27 so as to be slidable in the tape running direction, and is moved so as to reciprocate and screw-fed with a feed screw 39 driven by a motor 38 in the forward/rearward direction. A separating roller 40 is rotatably supported to the tape separating unit 14. Furthermore, this separating roller 40 swings up and down by a cylinder (not illustrated) etc. The separating roller 40 separates an unnecessary double-sided adhesive tape T' after cutting from the chuck table 12.

In the tape collecting section 16, a collecting bobbin 41 is supported by a vertical wall of the base 2, and operatively connected with a drive mechanism, such as a motor. That is, the unnecessary tape T' after cutting of the double-sided adhesive tape T is taken up by the collecting bobbin 41 by the operation of the driving unit, while the double-sided adhesive tape T of a predetermined quantity is delivered out from the tape feed section 10 and supplied on the wafer W.

Figure 6:
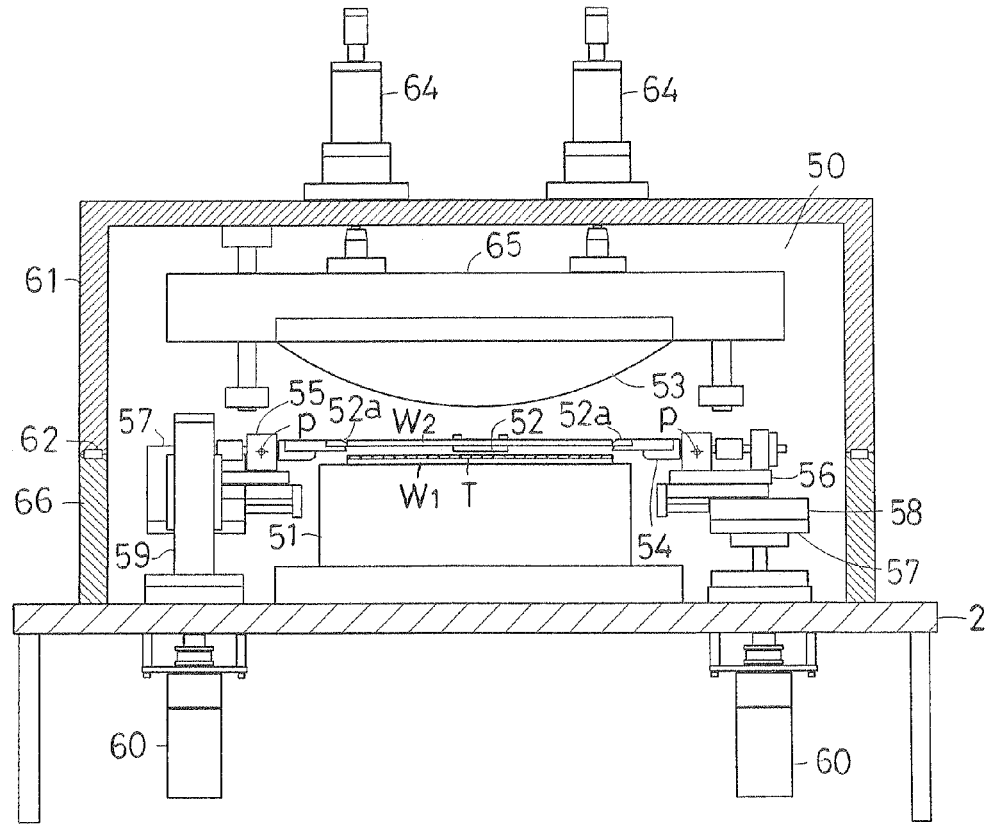
FIG. 6 is a front view of a mechanism for laminating a substrate.

As illustrated in FIG. 6, the mechanism for laminating a substrate 20 is provided on the base 2 and has a configuration installed in an openable and closable decompression chamber 50.

Figure 5:
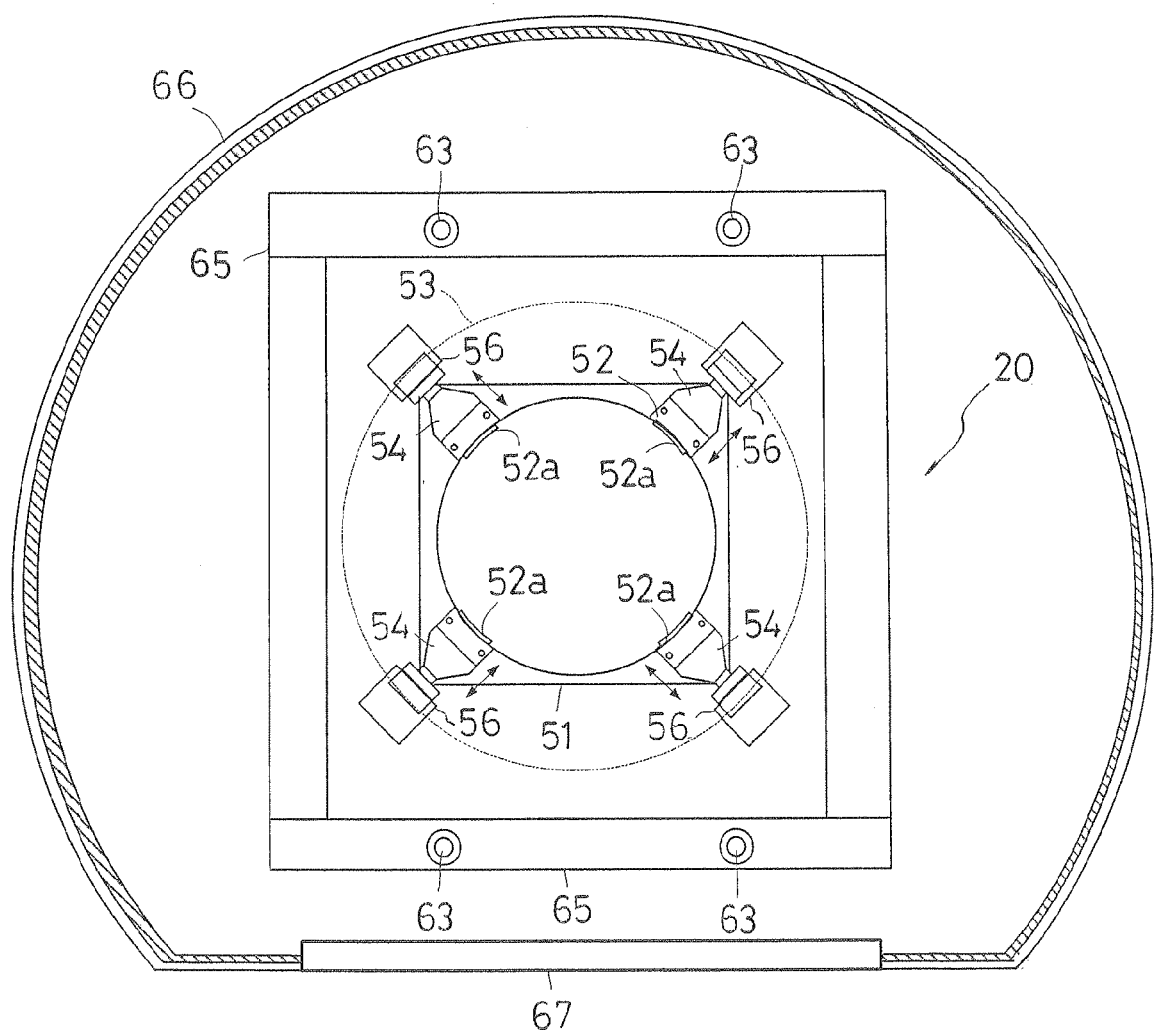
FIG. 5 is a plan view of a mechanism for laminating a substrate.

Furthermore, as illustrated in FIG. 5 and FIG. 6, the mechanism for laminating a substrate 20 includes: a holding table 51 of a vacuum absorption type for mounting and holding the wafer W1 in a horizontal attitude; two pairs of locking claws 52 for locking the peripheral edge of the supporting substrate W2 at four points; a pressing member 53 in a waiting position over the supporting substrate W2 in a condition for locking the supporting substrate W2 with these locking claws 52; and a driving device for these mechanisms. Detailed structure of each configuration will be described hereinafter.

The locking claw 52 is detachably linked with a holder 54 with a bolt. A locking part 52a having a shape of a segment of a circle for catching and locking the peripheral edge part of the supporting substrate W2 from downward at the edge part of the locking claw 52 in an uneven parallel position.

In a plan view, the holder 54 is swingably supported by a bearing bracket 55 from a horizontal attitude to a slanting attitude downward with a horizontal axial center p as fulcrum, and the bearing bracket 55 is mounted on the movable base 56. The movable base 56 is mounted on a lifting stage 57, and is driven by a linear horizontal drive mechanism 58 that is screw-fed with an air cylinder or a pulse motor so as to allow transverse and horizontal movement. That is, each locking claw 52 can travel between a holding position of the substrate, and a retracted position outside the substrate.

Furthermore, the linear horizontal drive mechanism 58 itself is mounted on the lifting stage 57 allowing ascending and descending along with a rail 59 installed upright on the base. This lifting stage 57 ascends or descends using a drive mechanism 60, such as an air cylinder or a pulse motor to ascend and descend each locking claw 52.

Figure 7:
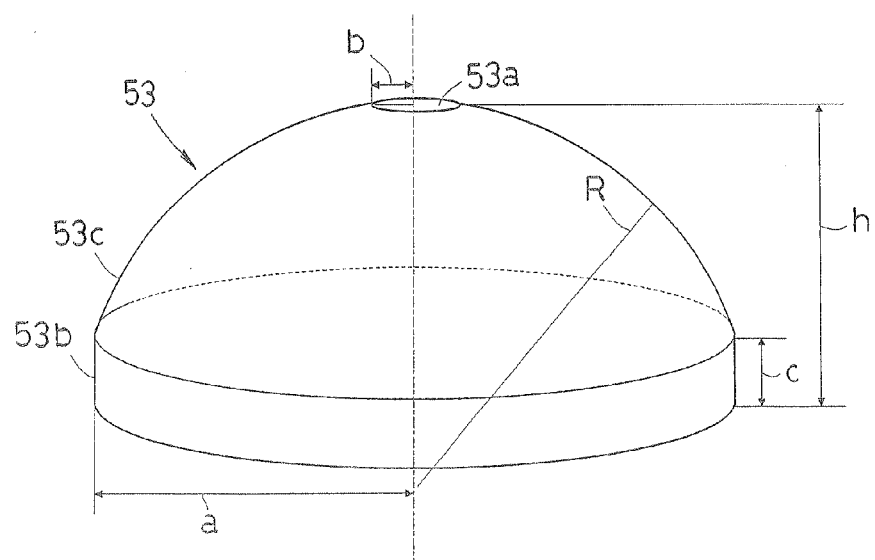
FIG. 7 is a perspective view of a pressing member.

The pressing member 53 is made of an approximately hemispherical elastic body having a larger diameter than a diameter of the wafer W1. For example, the top end serving as a starting point of pressing of the pressing member 53 has a flat surface 53a in the case of an apparatus by this example as illustrated in FIG. 7. This flat surface 53a can suppress the local action of the pressing force by the pressing member 53 on the supporting substrate W2. In other words, this flat surface 53a allows dispersion of the pressing force in a radial direction of the supporting substrate W2, leading to the action of an approximately uniform pressing force on the supporting substrate W2. Accordingly, suppression of breakage of the wafer W1, and efficient elimination of air bubbles to be possibly involved in an adhering surface may be attained. As a result, closer contact between the supporting substrate W2 and the wafer W1 will be attained without lamination non-uniformity in the peripheral part of the wafer W1.

Furthermore, the pressing member 53 has a cylindrical block 53b in an attached base end side. A height c of this cylindrical block 53b, a radius a, a radius of curvature R, and a radius b of the flat surface 53a of the hemispherical block 53c, a height h from the mounting attached base end surface to the top end of the block 53c and a hardness of the cylindrical block 53b etc. are suitably determined based on the size and the material of the wafer W1 to be laminated. That is, the height c of the cylindrical block 53b, is determined so that the portion of the hemispherical block 53c may give a height, in elastic deformation by pressing, for allowing deformation without any stress in a diameter direction and a height direction. The radius of the curvature R is determined in a range so that the pressing force spreads in a diameter direction (radial direction) of the supporting substrate W2 to give a uniform pressing force (surface pressure) to the supporting substrate W2. The radius a preferably has such a size that forces the elastically deformed pressing member 53 to contact the whole surface of the supporting substrate W2 and to cover the supporting substrate W2 in laminating the supporting substrate W2 on the wafer W1. For example, the size is approximately twice the diameter of the wafer W1. The radius b of the flat surface 53a is determined for a contact area to give a uniform surface pressure.

Furthermore, the pressing member 53 is preferably made of materials having a low friction coefficient and high heat resistance, and more preferably a low hardness. For example, preferably used are materials molded into a hemispherical block or a balloon with silicone rubbers, fluoro-rubbers, etc.

For example, when these conditions for the pressing member 53 are applied for lamination of a supporting substrate W2 having the same shape to a 6-inch wafer W1, detailed conditions are in the ranges of: the radius a of 600 mm; the radius b of the flat face 53a of 1 to 10 mm; the height c of the cylindrical block 53b of 10 to 40 mm; the radius of curvature R of 150 to 300 mm; the height h of the sum of both blocks 53b and 53c of 50 to 150 mm; and the hardness (Shore hardness) of 5 to 30. More preferable conditions are: the radius a of 600 mm; the radius b of the flat surface 53a of 3 mm; the height c of 25 mm; and the radius of curvature R of 200 mm. The top end has a hardness (Shore hardness) of 15, and the hardness increases from this top end gradually to the base end to give 20 at the base end part.

Here, although the above-described radius of curvature R is determined based on the assumption that the hemispherical block 53c has a spherical shape, methods of determination are not limited to the method.

Furthermore, the pressing member 53 is disposed for allowing ascending and descending within a cover case 61. That is, the cover case 61 includes an ascending and descending frame 65 that is up-and-down slidable by four guide shafts 63 and that ascends and descends by an air cylinder 64. This ascending and descending frame 65 is equipped with the pressing member 53.

As illustrated in FIG. 5 and FIG. 6, the decompression chamber 50 is constituted with an approximately cylindrical fixed peripheral wall 66 provided on the base, and the cover case 61 equipped to the fixed peripheral wall 66 via a hinge (not illustrated) in a vertically swingable, and openable and closable condition. Here, operation of a vacuum pump (not illustrated) enables pressure reduction of the interior of the chamber. In addition, all the peripheries of the upper end of the fixed peripheral wall 66 are equipped with a seal 62 in order to keep the interior of the chamber airtight by contact to all the peripheries of the lower end of the closed cover case 61. Furthermore, a shutter 67 allowing slide opening and closing is provided in a side face having a flat surface. That is, the wafer W1 and the supporting substrate W2 that are suction-held by the robot arm 17 are carried in from a shutter opening, and each of the wafer W1 and the supporting substrate W2 is held on the holding table 51 and with each locking claw 52.

Next, a series of operation for joining the supporting substrate W2 to the wafer W1 will be described using an apparatus by the above-described example with reference to Figures.

When initial setting, such as charge of each of the cassettes C1 to C3 and setting of the double-sided adhesive tape T is completed, operation of the apparatus starts. First, the first transport mechanism 7 rotates, and the substrate holding section 21 of the robot arm 6 of this mechanism is inserted in a clearance between the wafers in the cassette C1. The robot arm 6 suction-holds the wafer W1 from the back side with the substrate holding section 21, and transports the wafer W1 to the first alignment stage 9.

The position control is performed based on an orientation flat or a notch of the wafer W1 mounted in the first alignment stage 9. The wafer W1 suction-held by the robot arm 6 from the back side is transported to the chuck table 12 after position control.

Position control of the wafer W1 mounted in the chuck table 12 is performed, and it is suction-held. The tape joining unit 13 and the tape separating unit 14 are located in a left-hand side initial position, and the tape cutting mechanism 15 is located in an upper waiting position at this time as illustrated in FIG. 8.

Figure 9:
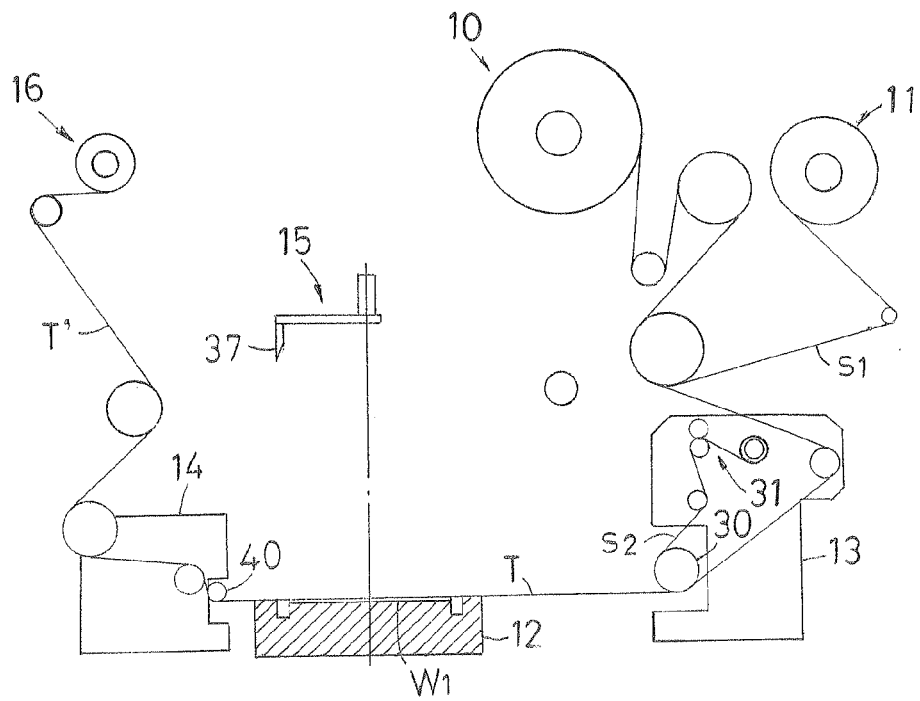

The joining roller 30 of the tape joining unit 13 rotates in a direction opposite to the tape running direction (from left to right in FIG. 9) while it presses the surface of the double-sided adhesive tape T (the top side of the second separator s2), after position control of the wafer W1 as illustrated in FIG. 9. This operation uniformly joins the double-sided adhesive tape T to the whole surface of the wafer W1.

At this time, the first separator s1 is separated from the double-sided adhesive tape T fed from the tape feed section 10 toward the wafer W1 in the course of the feed. Subsequently, the collecting bobbin 35 of the second separator collecting section 31 is controlled in synchronization with the movement of the joining roller 30. That is, the second separator s2 separated from the double-sided adhesive tape T by being wound and turned around by the joining roller 30 is taken up and collected at the same speed as the moving speed of the joining roller 30, and the upward adhesion face of the double-sided adhesive tape T is exposed.

Figure 10:
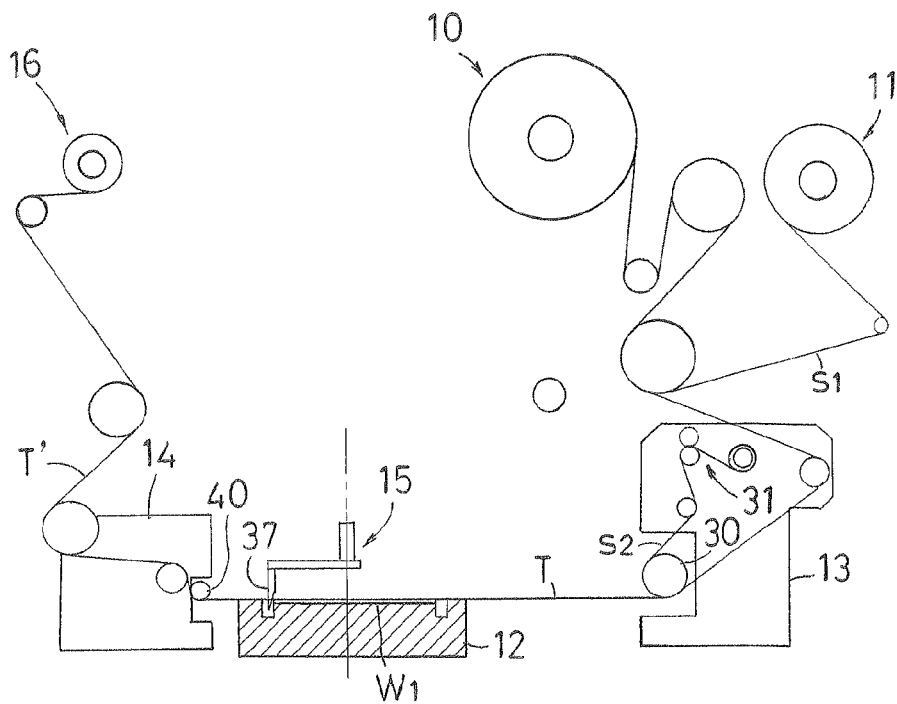

When the tape joining unit 13 arrives at an end position, the tape cutting mechanism 15 descends in a cutting processing position, and then the edge of a blade 37 is stuck in the double-sided adhesive tape T, and penetrates it, as illustrated in FIG. 10. Thereafter, rotation of the edge of the blade 37 cuts the double-sided adhesive tape T in an approximate wafer shape along with the peripheral edge of the wafer W1.

Figure 11:
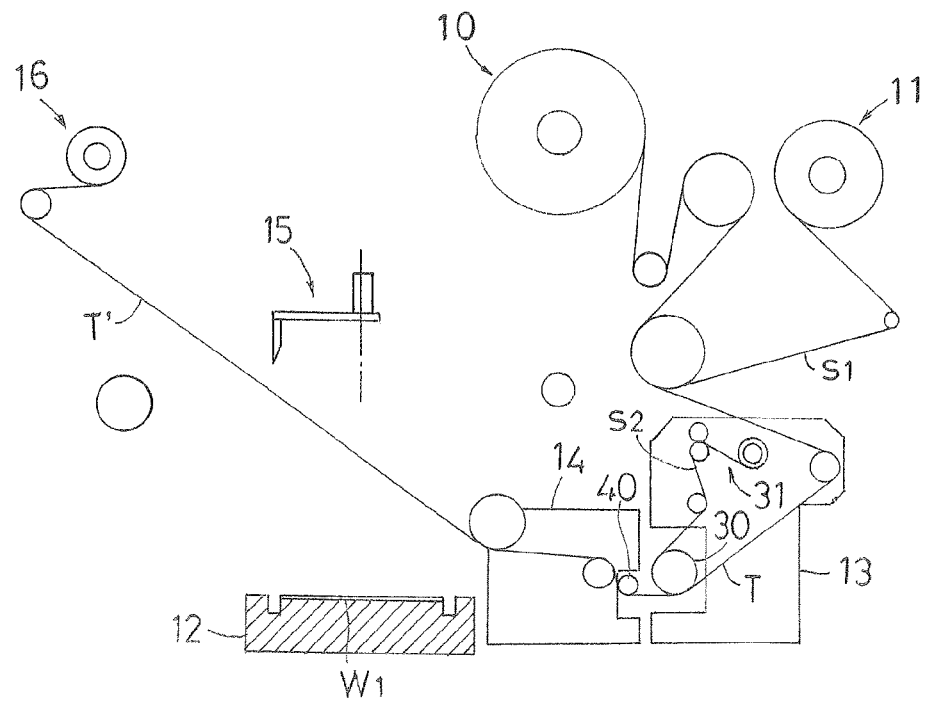

After cutting of the double-sided adhesive tape T, the tape cutting mechanism 15 ascends and returns to the waiting position, as illustrated in FIG. 11.

Subsequently, the tape separating unit 14 separates the unnecessary tape T' that has been cut on the wafer W1 by winding up, while the tape separating unit 14 moves on the substrate in a direction opposite to the sheet running direction (from left to right in FIG. 11).

When the tape separating unit 14 arrives at the end position of separating operation, the tape separating unit 14 and the tape joining unit 13 move in the tape running direction, and return to the initial position illustrated in FIG. 8. At this time, while the tape T' is taken up by the collecting bobbin 41, a fixed amount of the double-sided adhesive tape T is delivered out from the tape feed section 10.

The robot arm 6 sucks again the wafer W1 having the double-sided adhesive tape T joined thereto, and transports it to the second transport mechanism 8. The second transport mechanism 8 horizontally conveys the mounted wafer W1 to a delivery position of the second robot arm 17.

The wafer W1 transported by the second transport mechanism 8 in a delivery position is suction-held by the robot arm 17 from a downward face, then transported to the second alignment stage 19, and position control based on the notch etc. is performed. After position control, the wafer W1 suction-held by the robot arm 17 from the back side is transported to the holding table 51 in the decompression chamber of the mechanism for laminating a substrate 20. The wafer W1 is standing ready in a condition that the wafer W1 is suction-held with the holding table 51 until the supporting substrate W2 is transported by the mechanism for laminating a substrate 20.

When the wafer W1 is mounted on the holding table 51, the second robot arm 17 will start conveyance of the supporting substrate W2. That is, the second robot arm 17 inserts the substrate holding section 22 at the edge part thereof into a clearance between the supporting substrates in the cassette C1. The robot arm 17 removes out the supporting substrate W2 with the substrate holding section 22 by suction-hold from the back side, and transports the supporting substrate W2 to the second alignment stage 19.

The second alignment stage 19 performs position control by catching the supporting substrate W2 with a pair of locking claws 68. After position control is completed, the robot arm 17 suction-holds the supporting substrate W2 from a download surface that is a non-laminating surface thereof, turns over the supporting substrate W2 in the upper position, and transports it into the decompression chamber of the mechanism for laminating a substrate 20. Some of the supporting substrates W2 do not need turning over after the position control.

When the supporting substrate W2 is transported in, each locking claw 52 is horizontally moved to a predetermined position at the side of the center of the substrate that has been determined based on information beforehand inputted corresponding to the diameter of the supporting substrate W2. Then the locking part 52a of these locking claws 52 locks and holds the supporting substrate W2 by four-point support in a horizontal attitude. After lock hold is completed, the robot arm 17 is retracted from the decompression chamber 50. At this time, the wafer W1 suction-held by the holding table 51 and the supporting substrate W2 lock-held by the locking claws 52 are in a proximate facing condition.

When loading of the wafer W1 and the supporting substrate W2 is completed, the shutter 67 of the decompression chamber 50 is closed and sealed. Subsequently the internal pressure is decompressed, for example, at a pressure not more than 65 kPa (500 mmHg) by exhausting process. At this point of time, the pressing member 53 is in a waiting state over the supporting substrate W2.

When the decompression process is completed, a lamination start command is issued and lamination of the supporting substrate W2 to the wafer W1 is started.

Figure 12:
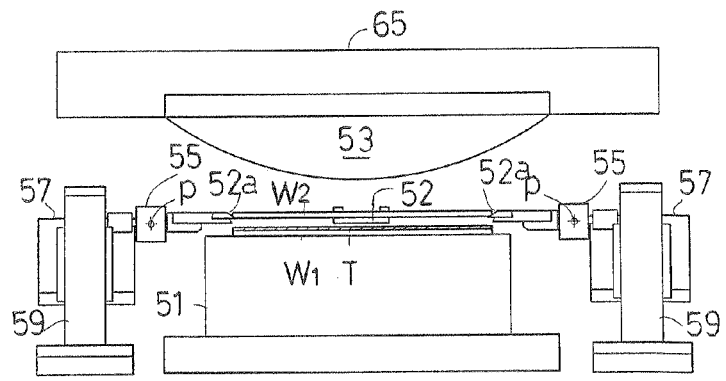
FIGS. 12 and 13 are views illustrating a laminating operation of a supporting substrate.
Figure 12:
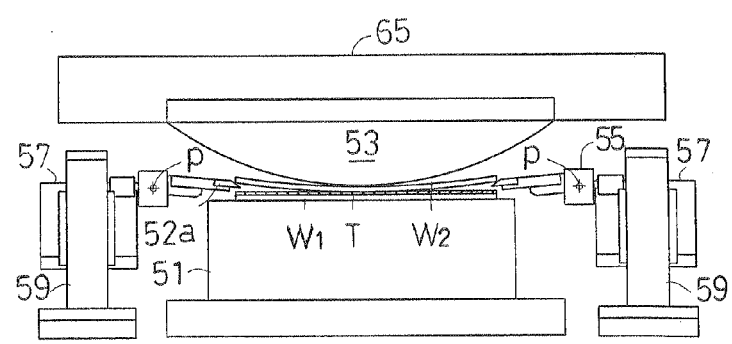
Figure 12:
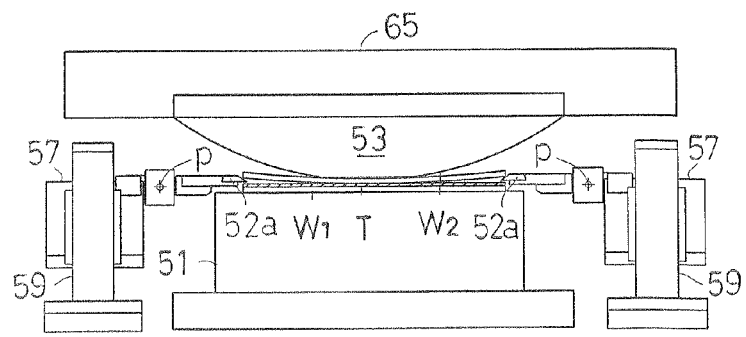

That is, as illustrated in FIG. 12 (a), when the lamination command is issued, the pressing member 53 in the upper waiting position of the supporting substrate W2 starts drop as illustrated in FIG. 12 (b). Following this drop operation, the downward edge part of the pressing member 53 contacts to approximate center of the supporting substrate W2, and presses the position to form a slight flexion to the supporting substrate W2, and thereby lamination between the center portions of the supporting substrate W2 and the wafer W1 is performed. At this time, the undersurface at the edge part of the locking claws inclines with the head thereof facing down corresponding to the flexion amount of the supporting substrate W2, and to an extent to avoid contact to the double-sided adhesive tape T.

As the pressing member 53 is dropped further associated with elastic deformation of the pressing member 53, as illustrated in FIG. 12 (c), the supporting substrate W2 is gradually laminated to the wafer W1, while the supporting substrate W2 is radially magnifying the contact area. At this time, the locking claw 52 descends to give a horizontal attitude so that the flexion amount of the supporting substrate W2 gives a fixed value.

Furthermore, this elastic deformation of the pressing member 53 magnifies the contact area to the supporting substrate W2. When the deformation comes to a predetermined position close to the peripheral edge of the supporting substrate W2, as illustrated in FIG. 13 (a), the locking claw 52 cancels the lock-hold of the supporting substrate W2 and retracts outside of the substrate in order that the locking claw 52 may avoid blocking of the lamination of the supporting substrate W2.

Figure 13:
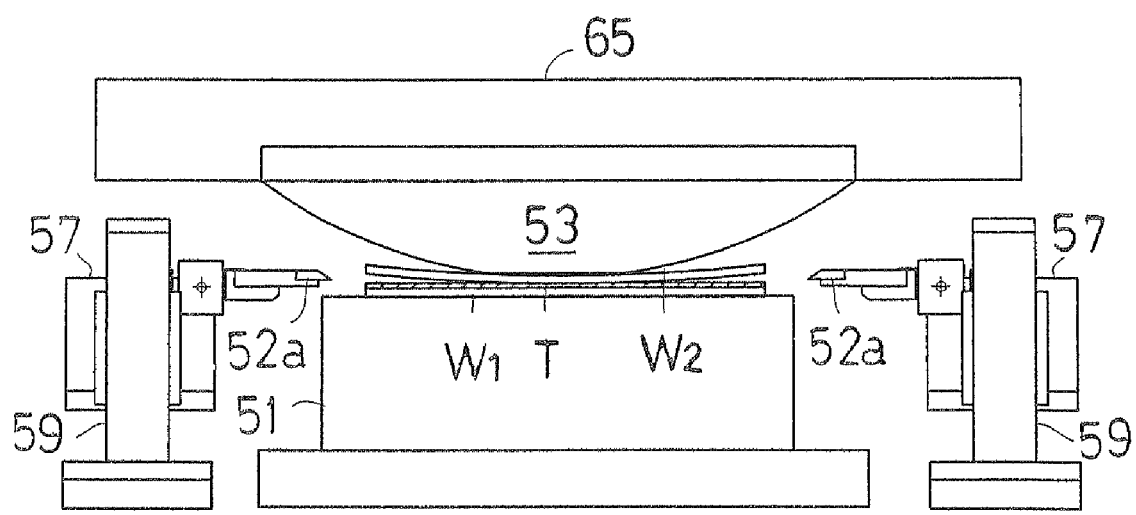
Figure 13:
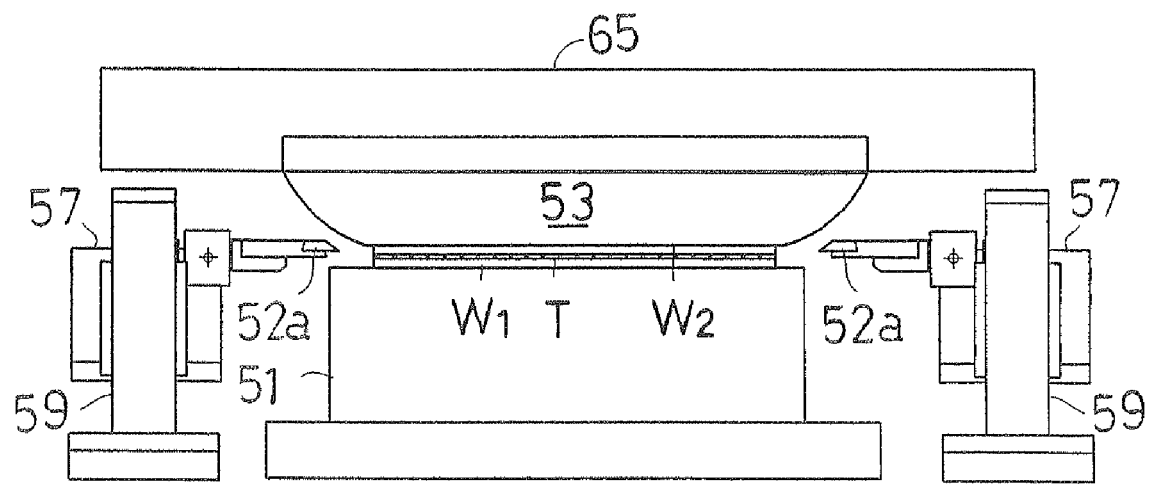

Subsequently, as illustrated in FIG. 13 (b), the pressing member 53 is further pressed, and thereby the elastically deformed pressing member 53 covers the whole surface of the non-laminating surface of the supporting substrate W2, leading to completion of the lamination of the supporting substrate W2 to the wafer W1.

When the lamination is completed, the pressing member 53 ascends and returns to the waiting position, ambient air is introduced to return the decompression chamber 50 to the atmospheric pressure, and subsequently the shutter 67 opens.

The robot arm 17 inserts the substrate holding section 22 at the edge thereof from the opening of the shutter, and removes out the wafer W1 having the supporting substrate W2 laminated thereto by suction hold. The robot arm 17 stores this removed wafer w1 into the cassette C3. One lamination process is completed in the above-described operation. The above-described operation is repeated, according the need.

Lamination of a supporting substrate W2 having the same diameter to that of the wafer W1 was illustrated in the above-described example, and the method of the present invention can be also performed by the same operation as in the above-described example in case of lamination of a supporting substrate W2 having a diameter a little smaller than that of the wafer W1.

The present invention is not limited to the above-described example, and may be implemented in modified manners as follows.

(1) The joining roller 30 rolls to join the double-sided adhesive tape T1 to the wafer W1. Then, a dedicated separator separating member prepared separately is moved along with the wafer W1 to separate the second separator s2. In this case, a small-diameter separating roller or a knife edge-like member is used as the separator separating member. As a result, the second separator s2 can be smoothly separated from the double-sided adhesive tape T.

In the above-described example, that is, a second separator collecting unit is provided in addition to the tape joining unit 13. In other words, the first tape joining unit 13 has only the function of the joining roller 30. The second separator collecting unit is equipped with an edge member in place of the joining roller 30 of the tape joining unit 13.

Figure 14:
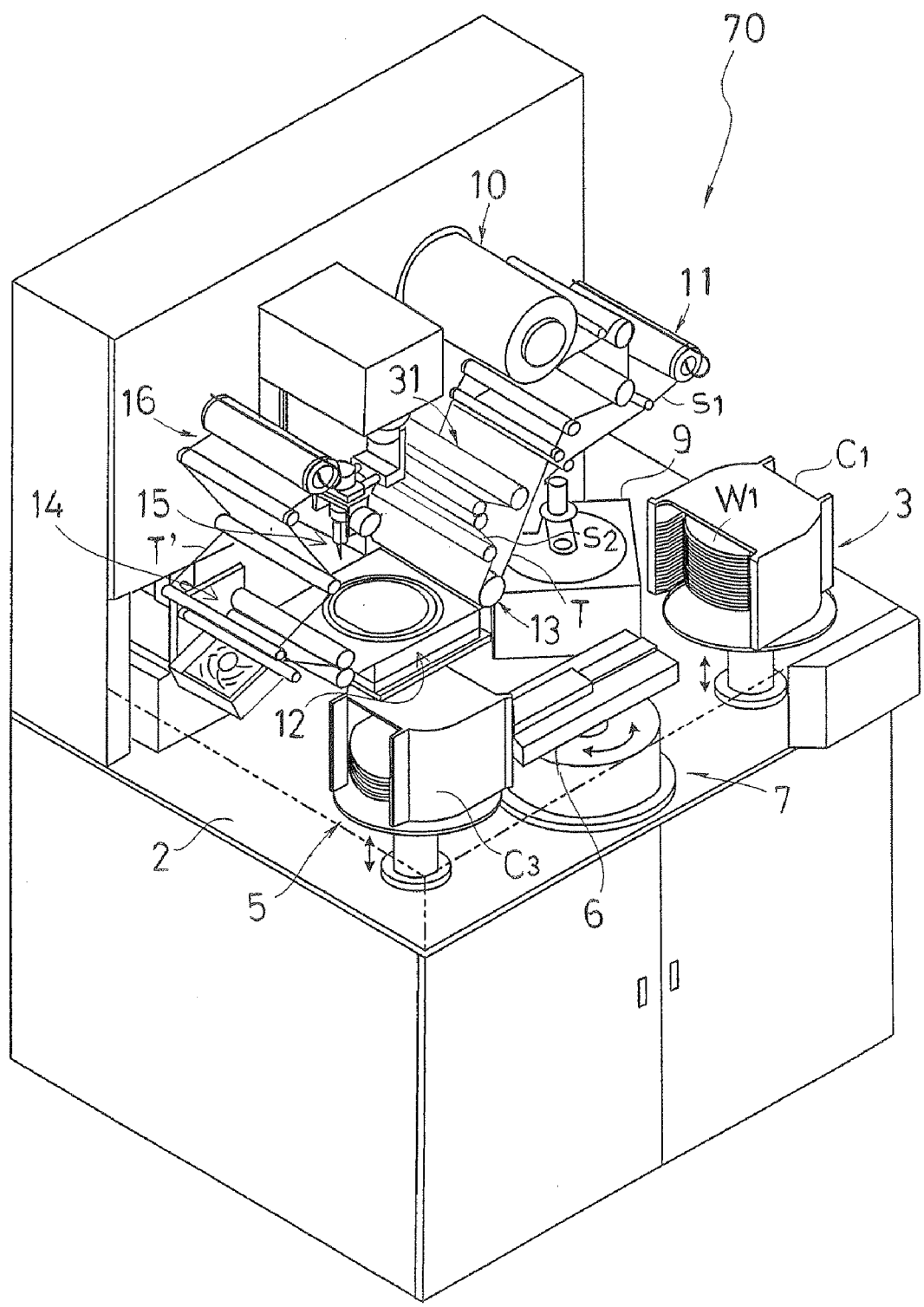
FIG. 14 is a view illustrating a laminating operation of a supporting substrate.

(2) As illustrated in FIG. 14, a tape joining apparatus 70 that performs the double-sided adhesive tape joining process and the cutting of the tape is configured without provision of the supporting substrate feed section 4 and the mechanism for laminating a substrate 20 in the above-described example. Then, the processed wafer W1 having the double-sided adhesive tape T joined thereto is transported in a dedicated apparatus for laminating a substrate in which a supporting substrate W2 for reinforcement is laminated on the processed wafer W1.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for joining a double-sided adhesive tape to a substrate, the method comprising:

separating, from a first adhesion face of a double-sided adhesive tape having first and second separators attached to front and back adhesion faces thereof, the first separator, and joining the double-sided adhesive tape to a surface of a substrate;

joining the double-sided adhesive tape to the substrate while a joining roller provided in a tape joining unit presses the second separator with rolling, and taking up the second separator wound and turned around by the joining roller and separated from a second adhesion face of the double-sided adhesive tape in a second separator collecting unit provided in the tape joining unit while rolling the joining roller synchronously; and cutting the double-sided adhesive tape joined to the substrate with the adhesion faces thereof being exposed along with a contour of the substrate.

2. The method according to claim 1, further comprising:

laminating a supporting substrate for reinforcement on the second adhesion face after cutting of the double-sided adhesive tape into a shape of the substrate in the tape cutting process.

* * * * *